United States Patent [19]

Dingwall et al.

[11] Patent Number: 4,924,225
[45] Date of Patent: May 8, 1990

[54] ANALOG TO DIGITAL CONVERTER WITH INTEGRAL LINEARITY ERROR COMPENSATION AND METHOD OF OPERATION

[75] Inventors: Andrew G. F. Dingwall, Princeton Township, Mercer County; Victor Zazzu, Montgomery Township, Somerset County, both of N.J.

[73] Assignee: Harris Semiconductor Patents, Inc., Melbourne, Fla.

[21] Appl. No.: 149,514

[22] Filed: Jan. 28, 1988

[51] Int. Cl.$^5$ .............................................. H03M 1/06
[52] U.S. Cl. .................................... 341/118; 341/155
[58] Field of Search ...................... 323/353, 354, 369; 341/118, 155

[56] References Cited

U.S. PATENT DOCUMENTS

3,710,377  1/1973  Guillen et al. ............. 340/347 AD
4,496,935  1/1985  Inoue et al. ................. 340/347 CC
4,650,347  3/1987  Shigemura et al. ................. 323/354

Primary Examiner—William M. Shoop, Jr.
Assistant Examiner—Marc S. Hoff
Attorney, Agent, or Firm—Henry I. Schanzer

[57] ABSTRACT

Integral linearity error in the operating characteristics of an analog to digital converter employing sampling comparators is reduced by recurrently connecting at least one resistive shunt across a predetermined central portion of a reference voltage divider input to the comparators. The shunt resistance is approximately an order of magnitude larger than the resistance of the shunted part of the divider. Each recurrent connection interval is of fixed duration independent of sampling rate, and each interval spans the beginning of a recurrent time of connection of said divider to said comparators.

17 Claims, 4 Drawing Sheets

ANALOG TO DIGITAL CONVERTER WITH INTEGRAL LINEARITY ERROR COMPENSATION AND METHOD OF OPERATION

FIELD OF THE INVENTION

This invention relates to analog to digital converters, and it relates in particular to circuits for compensating for integral linearity error in the output of such converters.

BACKGROUND OF THE INVENTION

In analog to digital signal converters employing sampling comparators, each input analog signal sample is simultaneously compared to a plurality of different reference signal levels to determine approximately what the sample amplitude is. One comparator of a type commonly used in the art is disclosed in U.S. Pat. No. 3,676,702 to E. P. McGrogan, Jr., the disclosure of which is hereby incorporated herein by reference. The determined amplitude value is then converted to a corresponding digitally represented, e.g., binary coded, value for such further utilization as may be appropriate.

It is well known that sampling comparators are subject to parasitic capacitance effects at their input connections. Those effects cause integral linearity error, sometimes called S-bow error, in the overall response characteristic of the digital to analog converter. That error is the cumulative effect of differential linearity error, resulting from the same parasitic capacitance effect, evident in each least significant bit (LSB) sized step of the characteristic. The problem of integral linearity error is described in greater detail, as "long term recovery error" and under the subheading "Accuracy'" in a paper by one of the inventors herein entitled "Monolithic Expandable 6 Bit 20 MHz CMOS/SOS A/D Converter" by A. G. F. Dingwall, IEEE Journal of Solid-State Circuits, Vol. SC-14, No. 6, Dec. 1979 pages 926–932. The problem will also be hereinafter further discussed to a limited extent in connection with disclosure of the present invention.

Some prior attempts to overcome the problems of integral linearity error have, as is pointed out in the aforementioned Dingwall paper, turned in the direction of providing a low-resistance reference supply voltage divider to supply the various levels of reference voltage required. Such a divider takes the form of a single, tapped, metal line; and divider current is so large that variations from ideal, caused by charging and discharging of the comparator parasitic capacitances, are essentially negligible. However, that large current involves correspondingly large power consumption. The latter factor is one to be avoided in present day systems design where one focus is on minimizing the cost and heat dissipation difficulties associated with large power consumption.

SUMMARY OF THE INVENTION

Problems of integral linearity error and power consumption are significantly reduced in an analog to digital converter of the invention by generating a further error signal of approximately a mirror image configuration with respect to said integral linearity error, and at least partially offsetting the integral linearity error by applying said further error in opposition to said integral linearity error.

In accordance with one aspect of the present invention, the analog to digital converter includes means for developing a plurality of different reference voltages, means for comparing an input analog signal to said plurality of different reference voltages to develop a digital output signal corresponding to said analog input signal said output signal including a predetermined degree of integral linearity error, and means coupled to said developing means for generating a further error in a sense to offset at least in part said integral linearity error.

In one embodiment of the invention, the further error is generated by reducing the resistance of a central portion of a reference supply voltage divider for sampling comparators in the analog to digital converter at each recurrent time of application of reference voltage to the comparators.

In accordance with yet another aspect of the invention, a fixed duration time interval is established for applying the resistance reduction so that the amount of the resistance reduction need not be changed when the sampling frequency of the converter is changed.

BRIEF DESCRIPTION OF THE DRAWINGS

A more complete understanding of the invention may be obtained from a consideration of the following Detailed Description and the appended claims in connection with the attached drawings in which:

DETAILED DESCRIPTION

Figure 1:
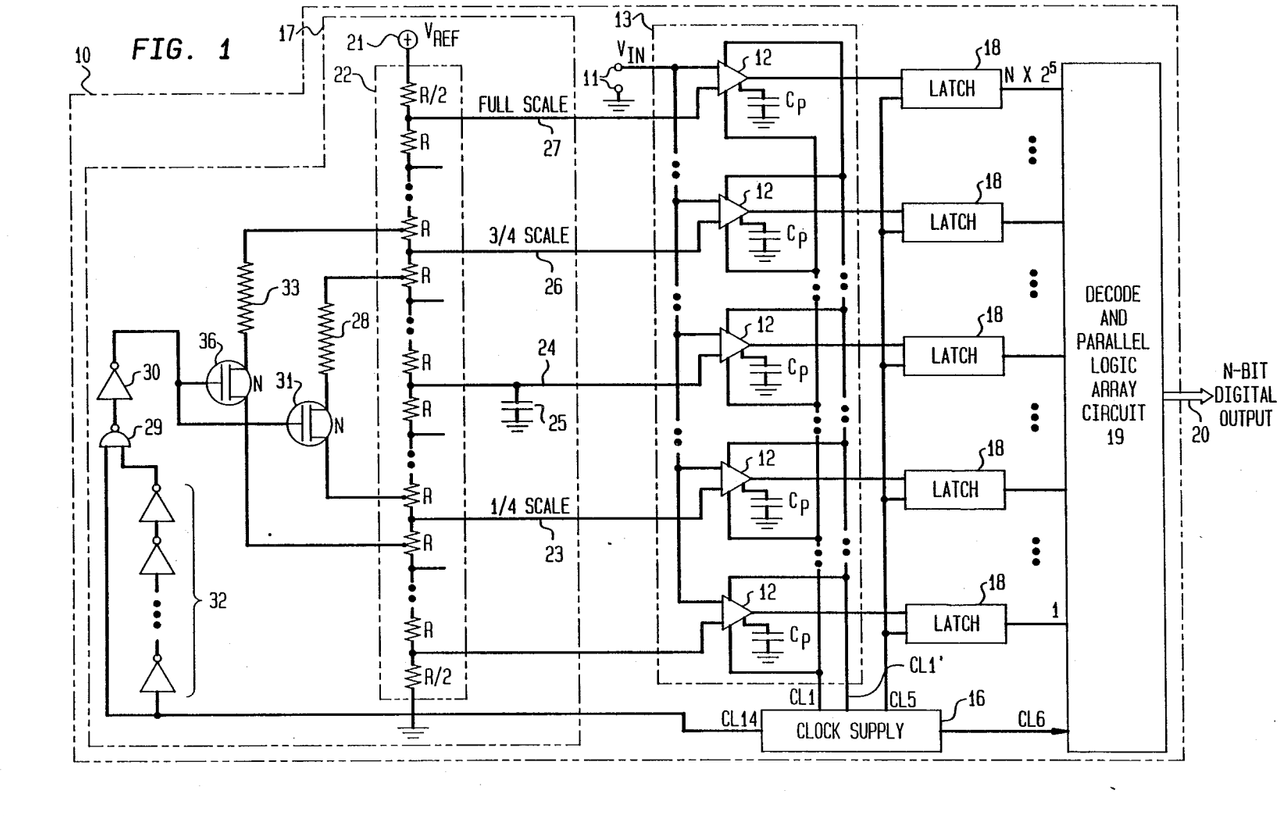
FIG. 1 is a circuit diagram of an analog to digital converter employing the present invention.

FIG. 1 illustrates an analog to digital converter 10 within the outer dashed-line box utilizing integral linearity error compensation of the present invention. An analog input signal $V_{IN}$ is applied from converter input terminals 11 to a voltage monitoring input terminal of each of a plurality of sampling, voltage comparators 12 of a comparator set 13 shown within a dashed-line rectangle. Only five comparators are indicated in FIG. 1 in order to preserve understandability of the drawing, but in an illustrative application converter 10 produces an N-bit digital output where N-8. In that application, 256 of the comparators 12 are employed. Each comparator is advantageously of the type described in the aforementioned McGrogan patent and, for the convenience of the reader, further illustrated and described herein in connection with FIG. 7.

Comparators of the set 13 are individually referenced to different voltage levels provided by a compensated reference voltage supply 17 shown within a dashed box in FIG. 1. Compensation is provided in accordance with one aspect of the invention to offset at least in part the effect of integral linearity error in converter 10 output and believed to be the result of parasitic capacitance in comparators 12. The compensation is illustratively implemented, as will be subsequently further described, by recurrent connection of at least one resistance shunt, e.g. $R_{28}$ and $R_{33}$, to alter the voltage distribution among output reference terminals of supply 17 during times when the parasitic effects are most damaging to linearity. Recurrent connection is achieved by clocked logic including a gate 29, inverters 30 and 32, and transistors 31 and 36. Output states of 256 comparators 12 are captured in respective latch circuits 18 and decoded to an N-bit digital output signal by a decode and parallel logic array circuit 19. The compensated reference supply 17 and comparators 12 of FIG. 1 will now be considered in greater detail in connection with the FIGS. 4 and 5 timing diagrams of comparator input analog and reference sampling functions, respectively, the FIG. 6 reference compensation switching function, the FIG. 7 simplified circuit diagram of an illustrative one of comparators 12, and the signal versus time diagrams of FIGS. 8-11 illustrating comparator operation.

It is sufficient to note at this point that each comparator simultaneously samples alternately, under control of complementary clock signals CL1 and CL1' from a clock signal supply 16, its signal monitoring input and a reference voltage input from the compensated reference voltage supply 17. That strobing of the comparator input terminals may be at any of predetermined rates, and it is here illustratively considered to be in the range of 10 MHz to 20 MHz. Parasitic capacitance associated with the sampling function of each comparator 12 is schematically represented by respective parasitic capacitors Cp connected to the comparators.

In order to have suitably low power costs, it is advantageous to employ a relatively high resistance reference voltage supply. To that end, a supply voltage resistance of approximately 500 ohms is illustratively employed for a converter intended to operate in a sampling frequency range of ten to twenty megahertz (MHz) using comparators implemented in metal oxide semiconductor (MOS) technology. However, with such high reference supply resistance, comparator parasitic capacitances are unable to adjust their charges to stable conditions sufficiently rapidly at those frequencies, and the aforementioned integral linearity error results, as will be further discussed in connection with FIG. 2. That error is largely offset, in accordance with the present invention, by recurrently modifying the reference supply during a beginning portion, e.g., around a time $t_2$ in FIG. 5, of each sampling interval portion when comparators are sampling the reference voltage. The modification generates an at-least-partially offsetting reference voltage error as will be further described subsequently.

Figure 7:
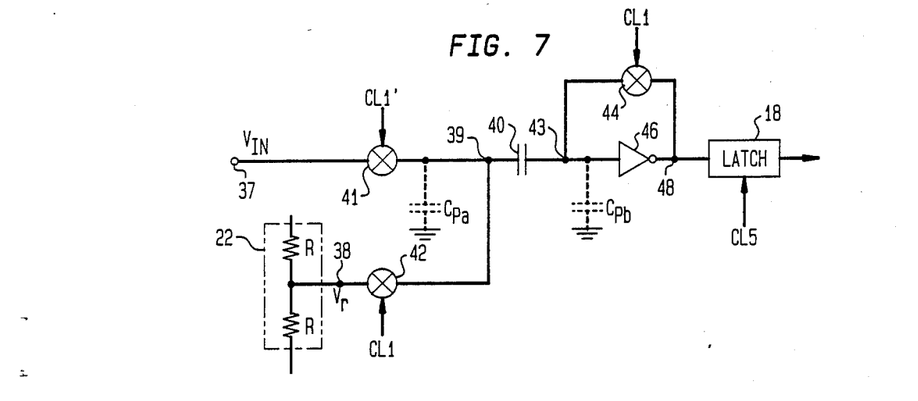
FIG. 7 is a simplified circuit diagram of a sampling comparator of a type which is useful in the converter of FIG. 1.

Comparators 12 each operates so that its output is a low, or binary ZERO, signal if the voltage $V_{IN}$ at its signal monitoring input is less than a predetermined, threshold, voltage level determined by the voltage $V_r$, indicated in FIG. 7, connected to its reference input; and its output is a high, or binary ONE, signal if the voltage at its signal monitoring input is more than the threshold voltage level. Consequently, comparators 12 connected to output taps from reference supply 17 which are at voltages less than a present input analog signal sample exhibit a high, binary ONE, output; and comparators 12 connected to reference output taps at voltages greater than a present input analog signal sample exhibit a low, binary ZERO, output. Such an output signal array, of all-ONEs above all-ZEROs, is in the art sometimes called a "thermometer scale" or a "bar coded scale;" and it is hereinafter called a bar coded scale. Outputs from the comparator set 13 are coupled through clocked latches 18, such as the well known D-type bistable circuits, to inputs of a decode-and-parallel-logic-array circuit 19. Circuit 19 includes logic circuits, of the type indicated in the aforementioned Dingwall paper, for performing two functions. Circuit 19 first identifies the one of its $N \times 2^5$ (256 where $N=8$ in the illustrative embodiment of an eight-bit output from the converter 10) inputs at which the bar coded scale of signals changes from ONE to ZERO. Circuit 19 also encodes that one-out-of-256 information into a corresponding eight-bit binary coded value, using, for example, a crosspoint matrix translation or a table-lookup function, and applies the appropriate signals to the eight leads of a digital output circuit bus 20.

The clock signal supply 16 fixes the converter sampling rate by providing the aforementioned complementary clocking signals to the comparators 12. Supply 16 also provides a sample rate signal CL5 to latches 18 to enable them to sample comparator outputs after they have settled following sampling of $V_{IN}$. The CL6 output of supply 16 enables circuit 19 to receive and process the latch outputs after new latch states have settled. Finally, a clock supply output CL14 is provided to reference supply 17 just prior to the time for sampling of reference outputs by the comparators to enable the recurrent compensation function in reference supply 17.

Reference supply 17 includes a resistive voltage divider 22 (shown within a dashed-line rectangle) which is divided into a plurality of equal resistances R, one of which is split into two halves, each half R/2 being connected at a different end of the overall divider. Each resistor R is approximately two ohms in the illustrative 256-comparator embodiment. Only eight of the divider resistances are actually shown. Tap circuits are connected to series circuit junction points between adjacent ones of the resistors of divider 22 and extend to the respective reference input terminals of the comparators of the set 13. Thus, the comparators are connected to regularly, i.e., equally, spaced resistance points on divider 22 and, in an ideal case, i.e., absent integral linearity error, they would be referenced to correspondingly equally spaced voltage points on the divider. The series combination of resistances R is connected across a voltage supply $V_{REF}$, otherwise designated 21 and schematically represented as a circled polarity sign to indicate connection to a source terminal of that polarity with the opposite polarity terminal connected to ground. On the converter output scale of 256 levels, or counts, and assuming an ideal linear distribution of the reference voltage for source 21 among the resistors of divider 22, one-quarter scale, midscale, three-quarter scale, and full scale level points are connected to corresponding comparators by tap circuits 23, 24, 26, and 27, respectively, at scale counts of 64, 128, 192, and 256 respectively. A capacitor 25 bypasses midscale tap circuit 24 to ground for noise, e.g., at the sampling rate, to stabilize the converter. For the illustrative embodiment operating at 20 MHz, capacitance of capacitor 25 is 0.1 microfarad.

Figure 2:
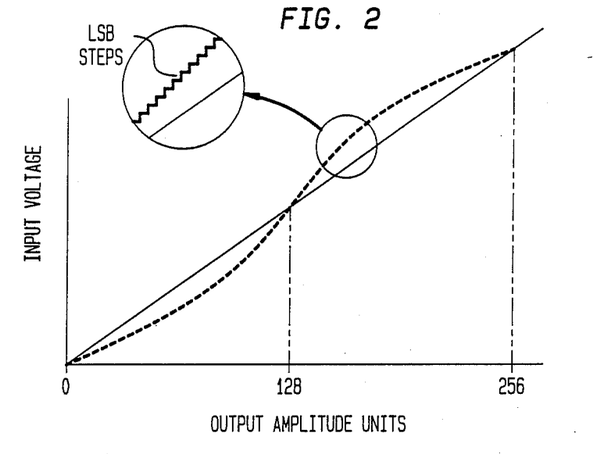
FIG. 2 is a plot of converter input voltage versus output amplitude and illustrating the integral linearity error problem.

FIG. 2 illustrates by a solid line the ideal converter input voltage versus output voltages. The output voltage is in terms of 256 LSB-sized divisions, here called amplitude units, of the illustrative 5-volt output voltage range. Operation of the converter 10 as described so far is well known to produce integral linearity error in that characteristic in high speed operations such as in the 10 to 20 MHz range of sampling frequencies. The real characteristic includes error in the ideal linearity of reference voltage distribution along the divider 22 as illustrated by the dashed curve in FIG. 2. As shown in the enlarged inset in FIG. 2, the dashed curve is actually made up of a stepped waveform corresponding to the LSB-sized steps in the digital approximation of converter input analog values.

Figure 3:
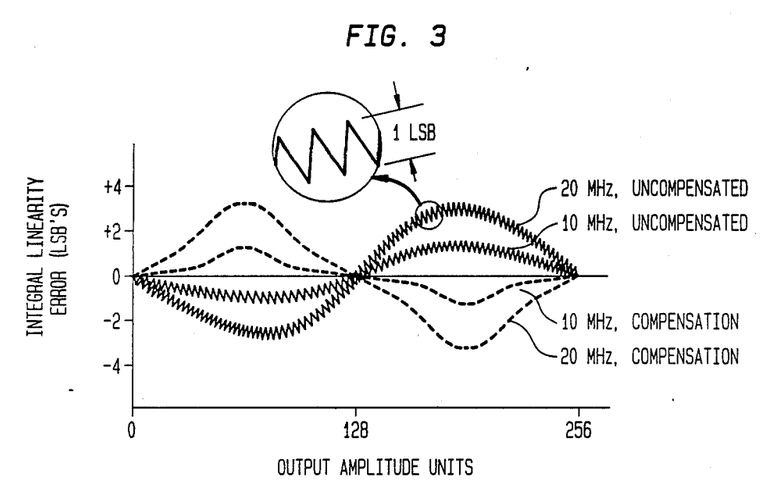
FIG. 3 is a plot of both integral linearity error and further error versus output amplitude at different frequencies.

FIG. 3 shows the same information replotted on the basis of integral linearity error versus output amplitude units. In this form, the stepwise digital approximation becomes a sawtooth of about one LSB amplitude superimposed on a curve having a shape similar to that of the real characteristic in FIG. 2. Two such composite curves are shown in FIG. 3, a relatively small one for a 10 MHz sampling rate embodiment and a larger one for a 20 MHz embodiment. Corresponding dashed-line curves for compensating, generated error, to be subsequently described, are also shown in FIG. 3. It is believed that the error is due to parasitic capacitance effects in the respective comparators, as described in the aforementioned Dingwall paper. The real error characteristic exhibits zero error with respect to the ideal at the zero, near midscale 128, and at full scale 256 output amplitudes regardless of sampling rate. Each generated error characteristic is approximately a mirror image of the corresponding real error characteristic, but the generated error exhibits more accentuated peaks than does the real error.

Figure 4:
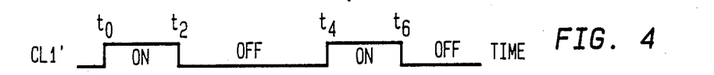
FIGS. 4–6 are timing diagrams illustrating operation of the invention.
Figure 5:
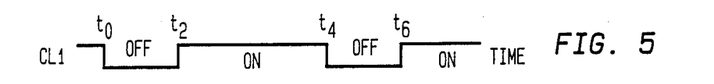

FIGS. 4 and 5 are timing diagrams showing the complementary clock signals CL1 and CL1' employed to strobe comparators 12. It is observed that those clock signals are asymmetrical in that ON, or high signal, times are different from OFF, or low signal times. Use of such asymmetry and its advantages are considered at length in a U.S. Pat. No. 4,633,222 to A. G. F. Dingwall and entitled "Clock Shaping Circuit and Method."

FIG. 7 shows a simplified diagram of an arbitrary one of the comparators 12 with an analog signal input terminal 37, to which the input signal VIN (from converter 10 input terminals 11 in FIG. 1) is applied in parallel to all of comparators 12. A comparator reference input terminal 38 receives a reference voltage $V_r$, from a tap between adjacent arbitrary ones of resistors R of divider 22 of reference supply 17 in FIG. 1. Reference voltage $V_r$ has a different value for each comparator 12. Terminals 37 and 38 are alternately coupled to a common signal input terminal 39 and a capacitor 40 through switches 41 and 42, respectively, under control of the clock signals of FIGS. 4 and 5. Capacitor 40 couples the voltage variations at terminal 39 to an input terminal 43 of an auto-zeroed inverter 46 which has a feedback circuit switched in conjunction with the switching of the reference input, i.e., the output and input of inverter 46 are connected together by a switch 44 while the comparator reference input 38 is being sampled between times $t_2$ and $t_4$ and after time $t_6$ of FIGS. 4–6 and 9–10. Parasitic capacitances $C_{Pa}$ and $C_{Pb}$, schematically shown connected adjacent to terminals 39 and 43, respectively, will be further discussed subsequently. A latch circuit 18 registers the output of inverter 45 for appropriate utilization. As shown in the McGrogan patent, switches 41, 42, and 44 are implemented in complementary Metal-Oxide- Semiconductor (MOS) technology and exhibit resistances of about five kilohms in the present state of the art.

Figure 8:
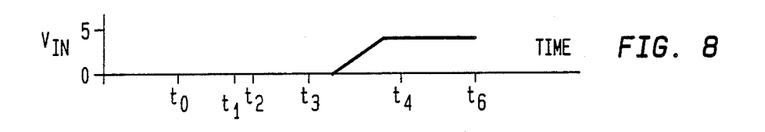
FIGS. 8–11 are signal voltage versus time diagrams illustrating operation of the comparator of FIG. 7.

FIGS. 8-11 are voltage versus time diagrams illustrating the operation of the comparator of FIG. 7 in a low frequency case where parasitic capacitances do not interfere with converter linearity. The illustration assumes an example in which the voltage of the reference source 21 in FIG. 1 is 5 volts, the comparator reference input terminal 38 (of FIG. 7) is connected at a 3-volt tap on divider 22, and the analog input voltage $V_{IN}$ is initially zero volts and changes to 4 volts just before time $t_4$ as shown in FIG. 8. Initially, prior to time $t_0$, switches 42 and 44 are ON (closed) and switch 41 is OFF (open). Terminal 39 ($V_{39}$) is at the $V_r$ voltage of 3 volts; and, because of the feedback through switch 44, terminals 43 ($V_{43}$) and 48($V_{48}$) are autozeroed at one-half the supply voltage. That supply voltage is included in the schematic representation of inverter 46. At time $t_0$ switch 41 is turned ON to sample input voltage $V_{IN}$, and switches 42 and 44 are turned OFF. Voltages at terminals 39 and 43 shift down by somewhat less than 3 volts, due to charge division between capacitor 40 and parasitic capacitance $C_{Pb}$ thereby causing the voltage $V_{48}$ at the output of inverter 46 to switch to nearly 5 volts. Prior to time $t_2$, the latch 18 is enabled to register the inverter output voltage level at terminal 48.

At time $t_2$ the switch states change to sample the reference voltage $V_r$ again. At a time during this reference monitoring operation, the analog input changes to 4 volts as shown in FIG. 8. At time $t_4$ switch 41 is turned OFF, and switches 42 and 44 are turned ON, and the terminal voltages begin adjusting to the new analog voltage value as shown in FIGS. 9–11.

Figure 9:
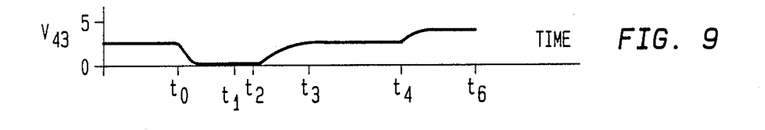
Figure 10:
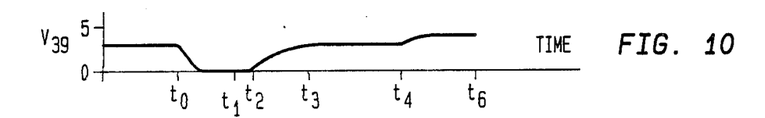
Figure 11:
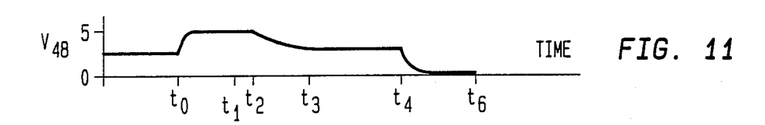

Parasitic capacitance, schematically indicated by the broken-line representations of capacitors $C_{Pa}$ and $C_{Pb}$ at either terminal of capacitor 40, considerably slows the voltage transitions from the ideal representations in FIGS. 9–10. Thus, when the frequency of converter operation is raised substantially from the low frequency initially assumed for the description of FIGS. 8–11, the time scale is compressed and insufficient time is available for circuit capacitances of the comparators 12 to adjust their charges fully after time $t_2$ to the voltages of the reference divider nodes to which they are attached. The plateau effect prior to time $t_4$ disappears and integral linearity error in converter output results from the consequent improper referencing, an effect that increases as sampling frequency increases. The same insufficient-time effect is less troublesome during the $V_{IN}$ sampling after times $t_0$ and $t_4$ for at least two reasons. During the $V_{IN}$ sampling, it is not necessary to bring the node 43 to a precise level since only positive or negative level shifting to trip the auto-zeroed inverter 46 is required. Also, the R−C time constant of the parasitic capacitance charging path is much smaller than during the reference sampling phase.

Each comparator is referenced at the same time to its particular voltage $V_r$ from divider 22. Parasitic capacitances delay the immediate achievement of the ideal reference charge, the difference between $V_{43}$ and $V_{39}$, on capacitor 40. The time required for that achievement depends upon the size of the last prior sample voltage $V_{IN}$ to all comparators and the size of the voltage $V_r$ to which a particular comparator must adjust. In applications such as that of the illustrative embodiment where sampling rate may be in the range of 10 MHz to 20 MHz, there is insufficient time to allow full stabilization of the parasitics of all of the comparators. The consequence of incomplete stabilization is improper referencing, and error in converter output results as already mentioned.

As each comparator parasitic adjusts it charge state toward its particular reference voltage $V_r$, it charges or discharges depending upon whether its voltage $V_{39}$ is greater than or less than its tap voltage $V_r$. One comparator which is referenced to a tap voltage which is at least approximately equal to the last prior input analog voltage $V_{IN}$ is here for convenience called a reference comparator, and its parasitic capacitance experiences little or no charging change during a reference sampling interval when that equality exists. For other comparators, however, the charging or discharging current flows through a portion of divider 22 and returns through parasitics of one or more other comparators which are discharging or charging, respectively. It can be said that the parasitic capacitances of such other comparators, above and below the reference comparator along the reference voltage divider, exchange charges. The currents injected into, or extracted from, parts of divider 22 during such an exchange alter the IR drop distribution, i.e., change the effective tap electrical spacing, among the divider resistances from the ideal distribution which would have yielded linear converter operation. In other words the effective electrical spacing of the divider taps is dynamically changed: so that, for the short interval when the reference is first applied, the taps in a central region are more widely spaced electrically than are the taps in regions on either end of the divider outside the central region.

That altered distribution results in the error indicated in FIGS. 2 and 3. The divider taps near the ends of divider 22 have zero or low error because they are essentially clamped at the reference voltage terminals or are subjected to relatively little parasitic capacitor current component flow. The midscale tap region has zero error because parasitic currents in the top half of the divider tend to make the $V_r$ of the tap at midscale lower than ideal, and those in the lower half tend to make $V_r$ at midscale higher than ideal. So the two effects tend to balance out to about zero on average near the midscale point.

In order to reduce the effect of integral linearity error, without using either an unduly low divider resistance or unusually low switch resistances (from a power dissipation standpoint), means are provided to generate $V_r$ error components of opposite senses with respect to those due to parasitic capacitances. In the present state of the art, unusually low switch resistances would be less than one kilohm. The generated error components, indicated by dashed lines in FIGS. 2 and 3, are made to be of sufficient magnitude to reduce the net error, i.e., uncompensated error minus generated error, to a tolerable level for a particular type of application of the converter 10. In other words, the further error components also transiently modify the effective spacing if divider taps, but in this case the modification has the effect of reducing tap spacing in the central region of the divider and increasing tap spacing in the end regions. That effect tends to cancel the previously mentioned wider spacing without compensation.

Figure 6:
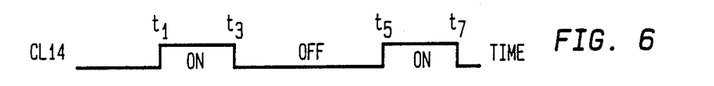

In the illustrative embodiment, the error generating means comprises circuits for shunting a central part of the divider 22 resistance during a beginning portion of the reference sampling phase of the converter operating cycle as illustrated in FIG. 6. There it is shown that the shunt is connected between times $t_1$ and $t_3$ and times $t_5$ and $t_7$. The resistance of the shunt and the location of its connections are selected to increase the IR drop in unshunted end regions of the divider 22, thereby accelerating the parasitic recovery and tending to restore the normal IR drop distribution among divider parts more quickly. The amount of the shunt resistance is that which approximately equalizes amplitudes of uncompensated error and error after compensation. The place of connection is selected to bridge regions of maximum charge current error and maximum discharge current error, i.e., between approximately the one-quarter and three-quarter scale points on the divider. One specific implementation of this type of compensation for integral linearity error will now be described in connection with the illustrative embodiment of FIG. 1.

Compensation for integral linearity error is achieved illustratively by shunting at least one central portion of the resistances R by a resistance approximately an order of magnitude larger than the divider 22 resistance during at least a beginning portion of a sampling interval part when the comparators 12 are sampling their respective reference voltages from supply 17. To that end, a resistor 28 is connected in series with the source-drain path of an N-channel MOS transistor switch 31 between symmetrically located circuit points on divider 22. Those points are advantageously slightly inside the one-quarter and three-quarter scale taps on the divider, i.e., slightly closer than those taps are to the midscale tap 24.

Figure 12:
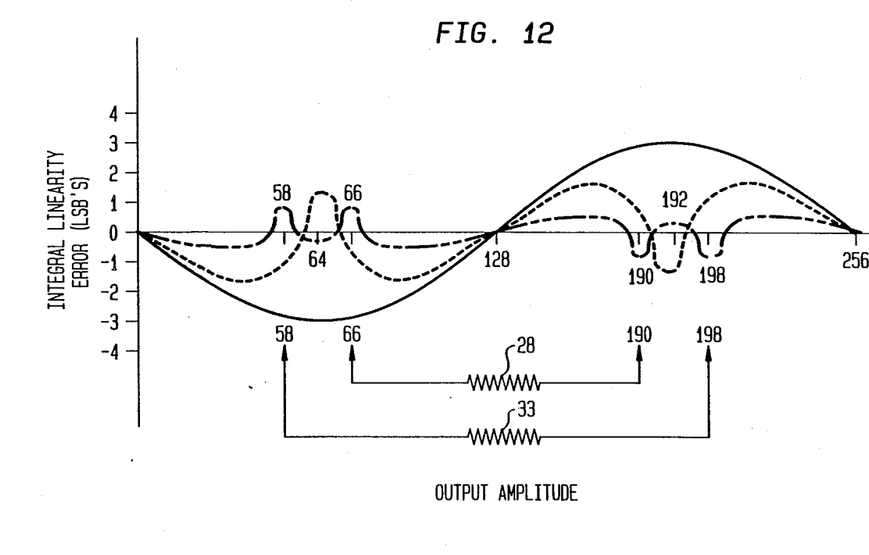
FIG. 12 is a plot of converter integral linearity error versus output amplitude and contrasting compensated operations, in difference embodiments of the invention, with uncompensated operation.

The exact positions of the resistor 28 shunt connections are not critical because, as can be seen in FIGS. 3 and 12, the uncompensated error curve has maximum amplitudes in regions of the curve which are relatively flat. A position is typically selected by trial and error to produce the lowest error amplitude, and that usually occurs when the positive and negative lobes of the compensated error curve are approximately equal. Such a curve is the dashed curve of FIG. 12. That curve includes in each half of the error characteristic a narrow central overcompensation lobe, of polarity opposite to the polarity of the lobe of the same half of the uncompensated characteristic, flanked by two broad lobes, of the same polarity as that uncompensated lobe. As indicated in FIG. 12, the overcompensation lobes occur at approximately the quarter points indicated by output amplitude counts of 64 and 192.

Returning to consideration of FIG. 1, the leading edge of the clock signal CL14 in FIG. 6 is coupled through a NAND gate 29 and an inverter 30 to the gate terminal of transistor 31 to turn that transistor ON for conduction in the shunt including resistor 28. (If an additional shunt including a resistor 33 is provided, as will be subsequently discussed, its transistor 36 is also turned ON at the same time.) The same clock pulse leading edge is coupled through a series of an odd number of tandem connected inverters 32, gate 29, and inverter 30 to turn the transistor 31 OFF a fixed time later. That fixed time is the same, regardless of the clock frequency; and in the illustrative embodiment, it is made to be about 25 nanoseconds by employing 21 inverters in the series 32. Inverters 30 and 32 are advantageously the type shown in the McGrogan patent, each inverter using a pair of complementary conductivity type MOS transistors. Use and advantages of a logic combination such as that of gate 29 and inverters 30 and 32 as a fixed pulse width generator is disclosed in the aforementioned Dingwall patent.

As indicated in FIGS. 1 and 6, the CL 14 clock signal actuates transistor 31; and it goes high at times $t_1$ and $t_5$, somewhat before gates 42 and 44 are actuated together, at leading-edge times $t_2$ and $t_6$ to sample the reference voltage. The time lead ahead of the leading edge time of the reference sampling function allows time for the shunt switching transients to settle before the sampling begins. The relatively long interval between times $t_1$ and $t_3$ allows the maximum opportunity for parasitic capacitance charges to stabilize at proper charge levels for representing respective reference voltages. That interval is fixed independently of clock frequency by virtue of the nature of the clock coupling circuit for clocking transistor 31. Consequently, if clock frequency is changed, the switching frequency of the shunt connecting transistor changes; and the duty cycle of the clock wave CL14 changes in the same sense; but the width of the switch turn-on pulse between times $t_1$ and $t_3$ stays the same.

It has been found that with this fixed, pulse width, clocking arrangement, the clock frequency, i.e., the converter input sampling rate, can be set at different values without the need to redetermine an appropriate new resistance for the reference divider shunt to match the reduced or elongated reference sampling time resulting from the frequency change. Likewise, for low frequency sampling, i.e., sampling rates well below the illustrative 10 MHz rate and at which the reference voltage is switched on significantly longer than the fixed correction pulse of FIG. 6, the transient error correction effects die out, and the final divider correction is negligible. As sampling rates increase, transient effects of error compensation contribute corrections which increase in proportion with sampling rate. Increasing correction results until the reference pulse becomes slightly shorter than the correction pulse, the maximal correction point.

The effect of the reference divider shunt is to reduce the total parallel resistance of the shunted portion of the reference divider. Hence, the voltage drop across the shunted portion of the divider is reduced, and the voltage drops across the remaining divider portions at either end of the reference divider are increased. This redistribution of divider voltages causes corresponding changes in the voltages at the respective tap circuits, and those changes have been found to comprise a further error which largely offsets the aforementioned integral linearity error.

FIG. 12 illustrates integrated linearity error for several different situations. Shunt resistor 28 is also indicated adjacent to the curves of FIG. 12 to illustrate the relationships of the shunt connection points to various features of the curves. A solid-line curve indicates in simplified form the uncorrected error for the 20 MHz case, which was illustrated in FIG. 3 with superimposed sawtooth variations. Dashed curves in FIG. 12 illustrate the error reduction improvement resulting from the single-shunt compensation for reference divider 22. It has been found in practice, and as shown in FIG. 12, that a single shunt results in a moderate amount of overcompensation, i.e., about one LSB of positive error at the uncorrected negative maximum and one LSB of negative error at the uncorrected positive maximum. Those overcompensated maximum points lie at the converter, symmetrically located, output scale points 64 and 192, i.e., just outside the symmetrical connection points 66 and 190 for the shunt resistor 28. Otherwise, the major lobes of the single-shunt compensated error are slightly less than an LSB in maximum amplitude, and those maximum points are at scale counts of about 58 and 66.

Some A/D converter applications require a still lower level of integral linearity error, and for those a second shunt is connected to somewhat different points on the reference divider 17 in FIG. 1. This second shunt includes a resistor 33 and another N-channel MOS transistor 36 connected in series between output count locations outside of the overcompensated maxima for the single-shunt case, i.e., between about the symmetrical 58-count and 198-count points in the illustrative embodiment. Those points are also outside of the one-quarter and three-quarter scale points of the divider 22 and define the outer limits of the central portion of the illustrative divider 22 which is shunted for integral linearity error compensation. Resistor 33 is illustratively of approximately 5500 ohms for the 10 MHz to 20 MHz example considered here in which the innermost first shunt is about 5000 ohms.

The combined effect of the two shunts is indicated by the dash-dot curve in FIG. 12. Together the two shunts reduce the overcompensation to about one LSB at each of two narrow positive excursions for the negative half of the uncompensated case and two narrow negative excursions for the positive half of the uncompensated case. Otherwise, the two shunts reduce the two-shunt-compensated error to about half of an LSB amplitude at the three relatively broad compensated maxima in each of the negative and positive portions of the uncorrected curve.

Additional shunts can be added to reduce error even further. Each additional shunt is placed between symmetrically located scale count points of major lobe maxima added by a last prior added shunt, if any. As previously mentioned, resistance of a first shunt is in general about an order of magnitude larger than the resistance of the overall uncompensated divider 22. In the present illustrative embodiment of a converter suitable for the operation in the 20 to 30 MHz sampling rate range, divider 22 has a resistance of about 500 ohms. Consequently, the resistance of the first shunt resistor 28 is about 5 kilohms. One way to determine more precisely specific shunt value is to measure, as a percent of the converter full scale output count, the extent of the integral linearity error to be compensated; and then select a first shunt resistance which will increase reference supply current in the unshunted end portions of the divider by the same percentage. If a second shunt is to be added, a similar process is followed. However, now the error to be compensated is the percentage of the converter output full scale count represented by the overcompensation peak amplitude caused by the first shunt; and the resistance sought is that which, when connected to shunt a somewhat larger central portion, including the first shunt, of the divider 22, will increase reference supply current in the unshunted end portions of the divider by the same percentage.

It is not appropriate to replace the two shunt resistors 28 and 33 by a single, resistance-equivalent, shunt resistor because the single equivalent resistance lacks the four distributed connection points of the two-shunt case that are necessary to achieve more broadly dispersed divider current and IR drop redistribution patterns. Those broader redistribution patterns more closely approximate customized compensation for parasitic effects to each pair of reference taps with symmetrically located connection points.

What is claimed is:

1. An analog to digital signal converter comprising:

means for developing a plurality of different reference voltages said means including a plurality of points at which the different reference voltages are produced;

means for comparing an input analog signal with said plurality of different reference voltages to develop a digital output signal corresponding to said analog input signal, said digital output signal including a predetermined degree of integral linearity error; and means coupled between two or more of said plurality of points for generating a voltage having an amplitude and polarity to offset at least in part said integral linearity error.

2. The analog to digital converter of claim 1 in which:

means are provided for actuating said comparing means at a predetermined rate in a recurrent cycle of sampling said input analog signal during a first time interval and comparing said input analog signal to said plurality of reference voltages during a second time interval; and said generating means comprises means for recurrently actuating said generating means at said rate and for a time interval of fixed duration independent of said rate, each of said time intervals of fixed duration including a beginning portion of one of said second time intervals.

3. An analog to digital signal converter comprising:

means for comparing an input analog signal to an array of different reference voltages;

a resistive voltage divider having connections for applying across opposite ends thereof a voltage supply of a predetermined reference voltage;

a plurality of circuit taps connected to different regularly spaced points along the length of said voltage divider:

means for switchably connecting each of said taps to a different input terminal of said comparing means; and means for modifying temporarily the effective distribution of said predetermined reference voltage among said taps during at least a beginning portion of each time of connection of said reference input terminals of said comparators to said taps.

4. The analog to digital converter of claim 3 in which said connecting means comprises:

means for cyclically strobing input terminals of said comparing means at a variable recurrence rate; and means, responsive to said strobing means, for actuating said modifying means during a recurring time interval of fixed duration independent of variations in said variable recurrence rate, each said recurring time interval including one of said beginning portions.

5. The analog to digital converter of claim 3 in which:

each of said comparators includes parasitic capacitance storing a charge having a magnitude, at a leading-time edge of said recurring time interval, that is a function of at least a prior signal voltage at its said input terminal during a connection time of such terminal, and a divided portion of said predetermined reference voltage at its said reference terminal during a connection time of said reference terminal to said divider;

prior to said recurring time interval, one of said comparators, a reference comparator, has its parasitic capacitance charged to a voltage approximately-equal to said reference voltage at its said reference terminal, those of said comparators connected to reference voltages higher than that of said reference comparator have parasitic capacitances charged to voltages less than their respective reference terminal voltages, and those of said comparators connected to reference voltages lower than that of said reference comparator have parasitic capacitances charged to voltages greater than their respective reference terminal voltages; and said modifying means comprises means for reducing parasitic capacitance charges or comparators below said reference comparator and increasing said parasitic capacitance charges of comparators above said reference comparator.

6. An analog to digital signal converter comprising:

means for comparing an input analog signal to an array of different reference voltages;

a resistive voltage divider having connections for applying across opposite ends thereof a voltage supply of a predetermined reference value;

a plurality of circuit taps connected to different regularly spaced points along the length of said voltage divider;

means for switchably connecting each of said taps to a different input terminal of said comparing means for a predetermined time; and means for modifying temporarily the effective distribution of said predetermined reference voltage among said taps during at least a beginning portion of each time of connection of said reference input terminals of said comparators to said taps.

7. The analog to digital converter of claim 6 in which said connecting means comprises:

means for cyclically strobing input terminals of said comparing means at a variable recurrence rate; and means, responsive to said strobing means, for actuating said modifying means during a recurring time interval of fixed duration independent of variations in said variable recurrence rate, each said recurring time interval including one of said beginning portions.

8. The analog to digital converter to claim 6 in which:

said parasitic capacitances cause error in said reference supply distribution to said comparator input connections;

said reducing and increasing means comprises at least one resistive shunt recurrently connectable between said symmetrical points approximately at divider points of maximum integral linearity error.

9. The analog to digital converter of claim 8 in which said at least one shunt comprises plural resistive shunts, each switchably connected between a different pair of symmetrically disposed points of maximum linearity error along said divider.

10. The analog to digital converter of claim 6 in which:

said regularly spaced tape connection points ideally effect a linear distribution of said reference voltage among said taps;

parasitic capacitances associated with said means for comparing an input signal cause a first error in linearity of said reference voltage distribution to aid comparator input connections; and said reducing and increasing means comprises means for generating a further error in said distribution for at least partially offsetting said first error.

11. The analog to digital converter of claim 6 in which said modifying means comprises means for temporarily reducing resistance of a central portion of the length of said voltage divider during said at least beginning portion.

12. The analog to digital converter of claim 6 in which said modifying means comprises means for temporarily increasing current from said reference supply in portions of said voltage divider on each side of said central portion of the length of said voltage divider during said at least beginning portion.

13. The analog to digital converter of claim 6 in which said modifying means comprises means for temporarily increasing the proportion of output voltage of said reference supply which is developed across portions of said voltage divider on each side of a central portion of the length of said voltage divider during said at least beginning portion.

14. The analog to digital converter of claim 6 in which said modifying means comprises means for temporarily effectively changing said regular spacing of said taps so that taps connected to portions of said voltage divider on either side of a predetermined central portion thereof have a temporary larger electrical spacing than do taps connected to said central portion during said at least beginning portion of said connection time.

15. The analog to digital converter to claim 6 in which said modifying means comprises:
means for switchably connecting at least one resistance shunt between predetermined symmetrically disposed points in respective halves of said divider during said at least one beginning portion of said connection time;
said symmetrically disposed points defining said central portion of said divider; and
said at least one resistance shunt having a resistance of approximately an order of magnitude larger than resistance of the shunted portion of said divider.

16. The analog to digital converter of claim 15 in which said connecting means comprises:
means for cyclically strobing input connections to said comparing means at a variable recurrence rate; and
means, responsive to said strobing means, for actuating said switchably connecting means to connect said at least one shunt to said voltage divider during a recurring time interval of fixed duration independent of variations in said variable recurrence rate, each said recurring time interval including one of said beginning portions.

17. A method of compensating an analog to digital signal converter for integral linearity error in its operating characteristic, where the converter includes means having a plurality of serially connected points for developing different reference voltages at these points and wherein the linearity error varies in one sense above the midpoint of said plurality of points and in another sense below said midpoint, the method comprising the steps of:
generating a further error of approximately a mirror image configuration with respect to said integral linearity error by coupling means between points above said midpoint and below said midpoint; and
at least partially offsetting said integral linearity error by applying said further error in opposition to said integral linearity error.

* * * * *